US008504970B1

(12) United States Patent
Malhotra et al.

(10) Patent No.: US 8,504,970 B1
(45) Date of Patent: Aug. 6, 2013

(54) METHOD AND APPARATUS FOR PERFORMING AUTOMATED TIMING CLOSURE ANALYSIS FOR SYSTEMS IMPLEMENTED ON TARGET DEVICES

(75) Inventors: Shawn Malhotra, Toronto (CA); Mark Ari Teper, Toronto (CA); Steven Caranci, Toronto (CA); Ketan Padalia, Richmond Hill (CA); Mark Bourgeault, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/176,126

(22) Filed: Jul. 5, 2011

(51) Int. Cl.
 *G06F 17/50* (2006.01)

(52) U.S. Cl.
 USPC .......................... 716/134; 716/108; 716/113

(58) Field of Classification Search
 USPC .......................... 716/108, 113, 134
 See application file for complete search history.

(56) References Cited

U.S. PATENT DOCUMENTS

2006/0101363 A1* 5/2006 Fry et al. ......................... 716/6

* cited by examiner

*Primary Examiner* — Vuthe Siek
(74) *Attorney, Agent, or Firm* — L. Cho

(57) ABSTRACT

A method for generating a design for a system to be implemented on a target device includes compiling the design. Information used to make a compilation decision on the design is stored. A strategy to improve timing closure on a signal path on the design is derived using the information.

26 Claims, 15 Drawing Sheets

US 8,504,970 B1

METHOD AND APPARATUS FOR PERFORMING AUTOMATED TIMING CLOSURE ANALYSIS FOR SYSTEMS IMPLEMENTED ON TARGET DEVICES

FIELD

Embodiments of the present invention relate to tools for designing systems on target devices. More specifically, embodiments of the present invention relate to a method and apparatus for performing automated timing closure analysis for systems implemented on target devices.

BACKGROUND

Target devices such as field programmable gate arrays (FPGAs), structured application specific integrated circuits (ASICs), and ASICs are used to implement large systems that may include million of gates and megabits of embedded memory. The complexity of a large system often requires the use of electronic design automation (EDA) tools to create and optimize a design for the system onto physical target devices. Among the procedures performed by EDA tools in a computer aided design (CAD) compilation flow are synthesis, placement, and routing of the system on the target device.

After a system has been synthesized, placed, and routed on a target device, it is important that the system achieves timing closure where all timing constraints in the system are met in order to ensure proper functionality. Long-path timing constraints, where delays of given paths are less than a maximum value, is an example of a timing constraint that is occasionally violated resulting in timing failure of a design.

In the past, some prior art tools attempted to help designers achieve timing closure by utilizing a static set of heuristics that applied generally to the EDA tool. The guidance provided by these prior art tools relied on global CAD settings to solve timing closure problems and did not address issues related to a specific system. Other prior art tools attempted to help designers with timing closure by providing raw information about timing failures. With these tools, the designer was left with the task of interpreting the data and drawing his own conclusions on how to use the data to resolve timing issues.

SUMMARY

A method and apparatus for generating a design for a system to be implemented on a target device is disclosed. According to a first embodiment of the present invention, information used for a compilation of the design is stored. A strategy to improve timing closure on a signal path on the design is derived from the information. A score that reflects a value of the strategy for improving the timing closure on the signal path is computed. The strategy is output with the score. According to a second embodiment of the present invention, a design for a system on a target device is compiled. Information used to make a compilation decision on the design is stored. A strategy to improve timing closure on the signal path on the design is derived from the information.

Embodiments of the present invention provide a designer with specific, actionable strategies to address potential causes of timing closure problems. A design's netlist, assignments, timing analysis data, and/or information used by an EDA tool to make compilation decisions resulting in design tradeoffs are analyzed to diagnose timing closure problems. By analyzing the design tradeoffs made during an earlier compilation of the design, alternative approaches may be derived with the benefit of knowing post-compilation results. According to an aspect of the present invention, a score is output with each strategy generated to allow the designer an opportunity to assess which strategies may be most relevant to the design.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
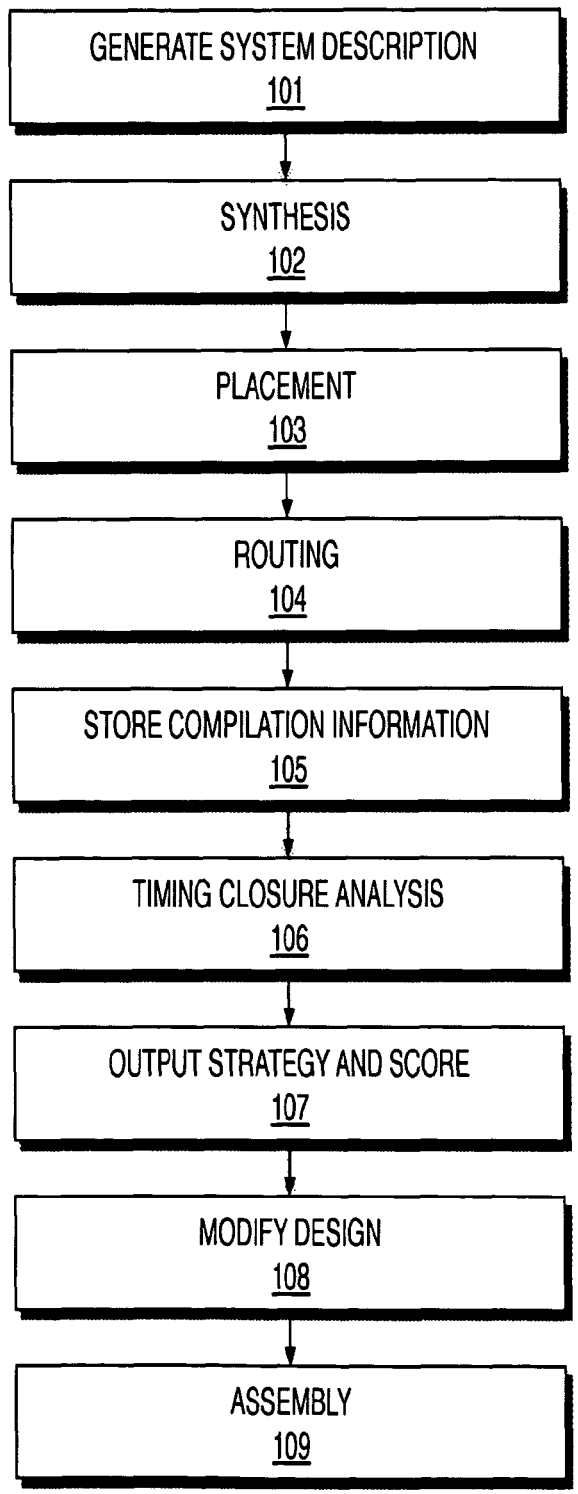
FIG. 1 is a flow chart illustrating a method for designing a system on a target device according to an exemplary embodiment of the present invention.

FIG. 1 is a flow chart illustrating a method for designing a system on a target device according to an exemplary embodiment of the present invention. The target device may be a field programmable gate array (FPGA), application specific integrated circuit (ASIC), a structured ASIC, or other programmable device. According to one embodiment, the procedure illustrated in FIG. 1 may be performed by a computer aided design (CAD)/electronic design automation (EDA) tool implemented on a computer system. At 101, a description of a system is generated. According to an embodiment of the present invention, hardware description language (HDL) design definition is generated to describe the system. The HDL is generated in response to specifications of the system provided by a designer. The specifications may be provided through a design entry tool. The specifications may describe components and interconnections in the system.

At 102, the system is synthesized. Synthesis includes generating a logic design of the system to be implemented by the target device. According to an embodiment of the present invention, synthesis generates an optimized logical representation of the system from the HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 103, the system is placed. According to an embodiment of the present invention, placement involves placing the mapped logical system design on the target device. Placement works on the technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 104, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 105, compilation information from procedures 101-104 is stored. According to an embodiment of the present invention, the compilation information may include netlists, assignments, timing analysis data, information used by an EDA tool to make compilation decisions resulting in design tradeoffs, and/or other information. It should be appreciated that the compilation information may be stored during or after each of the synthesis, placement, and routing procedures 102-104, or after all of the procedures 102-104 have been completed.

At 106, timing closure analysis is performed. According to an embodiment of the present invention, one or more timing closure analysis procedures are performed to determine potential causes of timing failures in the system and to derive a design-specific strategy on how to address the timing failure. Synthesis, placement, and routing utilize compilation procedures that apply heuristic-based optimizations that make tradeoffs. The timing closure analysis procedures may utilize the compilation information stored at 105 to derive a strategy that addresses timing failures. By analyzing the design tradeoffs made during an earlier compilation of the design with post-compilation results, suitable alternative approaches to achieve timing closure may be derived.

A score may also be generated to indicate a value of a strategy generated. The score may reflect a level of confidence on the strategy and may be based upon an estimated improvement in timing from using the strategy. According to an embodiment of the present invention, a score between 0 and 1.0 is generated for each strategy, with 1.0 representing a highest confidence level for the strategy. For a given path, the data required time from a source to sink is designated the value $D_R$. The estimated time which a generated strategy improves timing from the source to sink is designated the value $D_I$. The confidence is calculated as the minimum of 1.0 and $D_I/D_R$.

At 107, a strategy for improving timing closure on a signal path in the system is output with a score. According to an embodiment of the present invention, a plurality of strategies may be output for a single signal path. Based upon the score associated with a strategy, a designer may determine which of the strategies to implement. According to an embodiment of the present invention, timing analysis is performed for a plurality of signal paths. In this embodiment, the strategies having a score exceeding a threshold number are determined to be successful strategies. The number of times a particular strategy is determined to be successful may be output. This information may be helpful in identifying re-occurring issues in the design of the system.

It should be appreciated that the timing closure analysis at 106 and the outputting of strategy and score at 107 may be performed by an EDA tool in response to a designer selecting one or more specific signal paths to analyze. Alternatively, the timing closure analysis at 106 and the outputting of strategy and score at 107 may be performed automatically in response to the EDA tool detecting a timing failure on a particular path.

At 108, the design for the system is modified. According to an embodiment of the present invention, the design for the system may be modified by a designer manually by changing the HDL for the system in response to the strategy provided at 107. Alternatively, the design may be modified by changing user constraints, design constraints, or other parameters in response to the strategy provided at 107 and be re-compiled by re-executing one or more of procedures 102-104.

At 109, an assembly procedure is performed. The assembly procedure involves creating a data file that includes information determined by the procedures described at 101-108. The data file may be a bit stream that may be used to program a target device. According to an embodiment of the present invention, the procedures illustrated in FIG. 1 may be performed by an EDA tool executed on a first computer system.

The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

Figure 2:
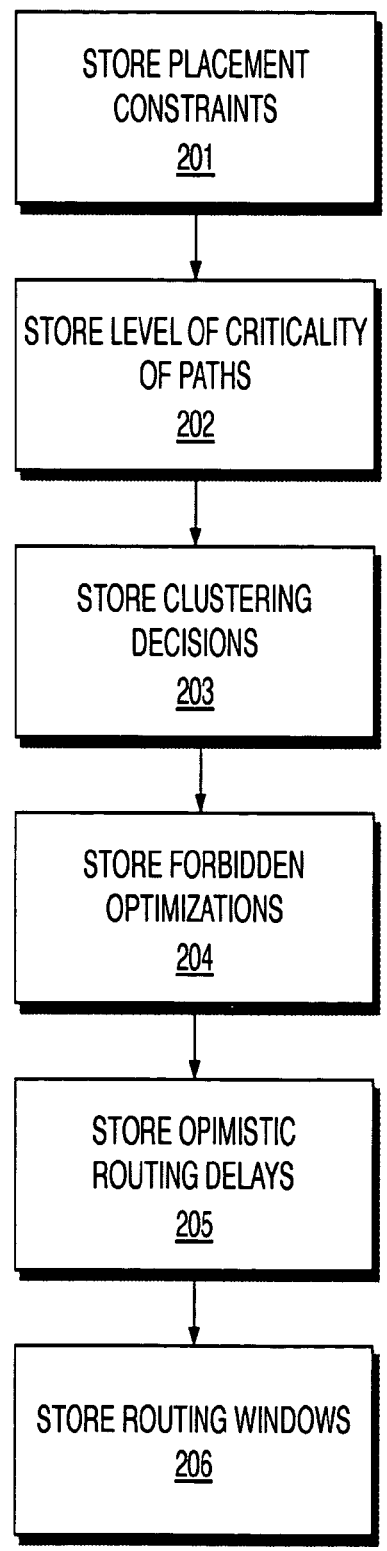
FIG. 2 is a flow chart illustrating a method for storing information used for making compilation decisions according to an exemplary embodiment of the present invention.

FIG. 2 is a flow chart illustrating a method for storing compilation information used for making compilation decisions according to an exemplary embodiment of the present invention. The procedure illustrated in FIG. 2 may be used to implement procedure 105 illustrated in FIG. 1. According to an embodiment of the present invention, the information used for making compilation decisions is stored in an internal database used by a CAD tool. At 201, placement constraints are stored. Placement constraints include user and CAD tool generated constraints that confine a given node or set of nodes to a particular region of a target device. Placement constraints restrict placement and may lead to sub-optimal results that impact timing. Since the CAD tool may be required to tradeoff an otherwise preferable solution for a less preferable placement solution in order to satisfy a placement constraint, the placement constraints on nodes in the system are stored.

At 202, levels of criticality of paths in the system are stored. A value indicating how time critical a signal path is in the design from the perspective of the EDA tool performing compilation is stored. The level of criticality assigned to a path by an EDA tool provides an indication as to how much effort was made by the EDA tool to satisfy timing closure for the path.

At 203, clustering decisions are stored. Clustering refers to a process where smaller building blocks are grouped together into larger building blocks, such as logic array blocks, during placement. Aggressive clustering may be performed to densely pack the smaller building blocks into the large ones. In some instances with aggressive clustering, smaller building blocks having unrelated functions are packed together in the larger building block, resulting in poor timing. According to an embodiment of the present invention, clustering decisions such as whether a particular building block sacrificed performance for density during placement is stored.

At 204, forbidden optimizations are stored. The identities of optimization techniques attempted, but disallowed for nodes in the design are stored. The reason for the restriction on performing the optimization technique may also be stored. An example of an optimization technique is register retiming. Register retiming may not be allowed in some instances, for example, when the retiming is attempted across a synchronizer chain or across a partition boundary.

At 205, optimistic routing delays are stored. An optimistic routing delay is the fastest possible route for a connection. This solution may not be feasible due to congestion, but may represent a lower bound on achievable interconnect delay for a given connection.

At 206, routing windows for a signal path are stored. A routing window may be defined as the time between a minimum delay (short-path timing constraint) and a maximum delay (long-path timing constraint) for the signal path.

It should be appreciated that other type of information may also be stored as compilation information. For example, the compilation information may include any constraints on optimization or describe any tradeoffs made by an EDA tool during synthesis, placement, and routing that may have an impact on timing closure of the design.

Figure 3:
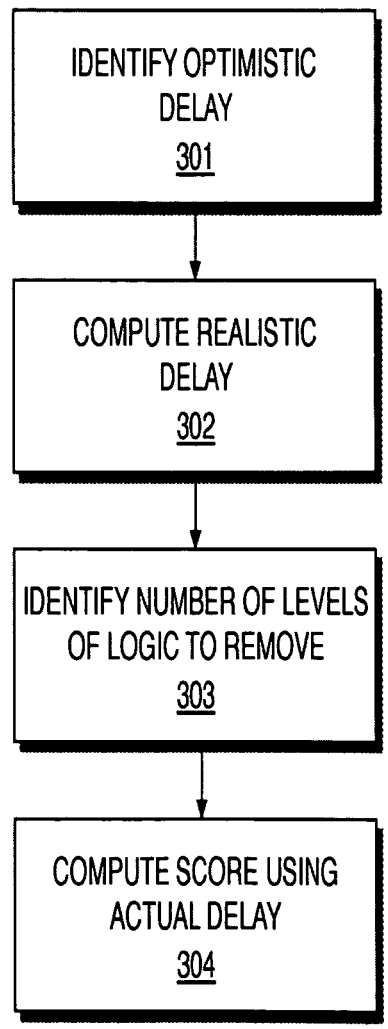
FIG. 3 is a flow chart illustrating a method for performing timing closure analysis on a signal path to address unachievable timing constraints according to an exemplary embodiment of the present invention.

FIG. 3 is a flow chart illustrating a method for performing timing closure analysis on a signal path to address unachievable timing constraints according to an exemplary embodiment of the present invention. In some instances, a signal path may have too many combinational levels (levels of logic or nodes) to reliably meet a timing constraint. Due to each level of logic requiring cell delay and routing delay, some timing constraints may be impossible or very difficult to meet given the number of levels of logic on the path. The procedure illustrated in FIG. 3 may be used to implement procedure 106 illustrated in FIG. 1. At 301, an optimistic delay is identified for the signal path. The optimistic delay is the fastest possible route for the signal path. According to an embodiment of the present invention, the optimistic delay for every signal path in a system is stored as compilation information in an EDA tool.

At 302, a realistic delay is computed for the signal path. According to an embodiment of the present invention, the realistic delay is a realistic estimation of the delay of the signal path that may be computed using empirical data.

At 303, a required number of nodes (levels of logic) to be removed from the signal path is identified which would allow the realistic delay of the signal path to be less than or equal to the optimistic delay. A strategy is generated to remove the identified number of nodes from the signal path. The number of nodes may be removed by targeted HDL changes on the path or by performing register retiming.

At 304, a score for the strategy described at 303 is computed using the actual delay on the signal path. According to an embodiment of the present invention, if the actual delay on the signal path is less than the optimistic delay, the timing constraint for the signal path is "Impossible" and the score for the strategy provided at 303 is 1.0 (high). If the actual delay on the signal path is less than the realistic delay, the timing constraint for the signal is "Reasonable" and the score for the strategy provided at 303 is 0.00 (low). If the actual delay on the signal path is between the optimistic delay and the realistic delay, the timing constraint for the signal path is "Aggressive" and the score for the strategy provided at 303 is the minimum of 1.0 and [amount of estimated delay improvement achieved by utilizing the strategy/required delay].

Figure 4:
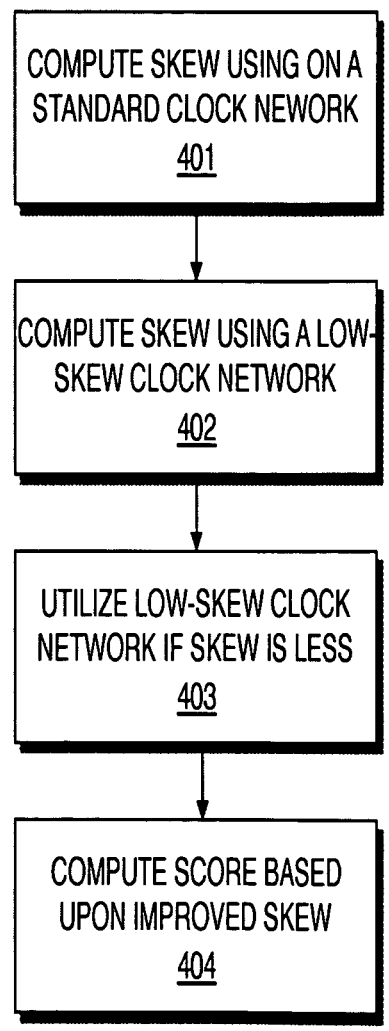
FIG. 4 is a flow chart illustrating a method for performing timing closure analysis on a signal path to address large clock skew according to an exemplary embodiment of the present invention.

FIG. 4 is a flow chart illustrating a method for performing timing closure analysis on a signal path to address large clock skew according to an exemplary embodiment of the present invention. Large clock skew between clocks on a source node and a sink node on a timing path shrink the timing window, making timing closure difficult. The procedure illustrated in FIG. 4 may be used to implement procedure 106 illustrated in FIG. 1. At 401, a first clock skew between a source node and a sink node on the signal path are computed where clock signals are transmitted on a standard clock network.

At 402, a second clock skew between the source node and the sink node on the signal path are computed where the clock signals are transmitted on a low-skew global clock network.

At 403, a strategy is generated to transmit the clock signals to the source node and the sink node on the signal path on the low-skew global clock network if the first clock skew is greater than the second clock skew.

At 404, a score for the strategy described at 403 is computed based upon the improvement in skew using the low-skew global clock network. According to an embodiment of the present invention, the score for the strategy provided at 403 is the minimum of 1.0 and [improvement in skew/skew required].

Figure 5:
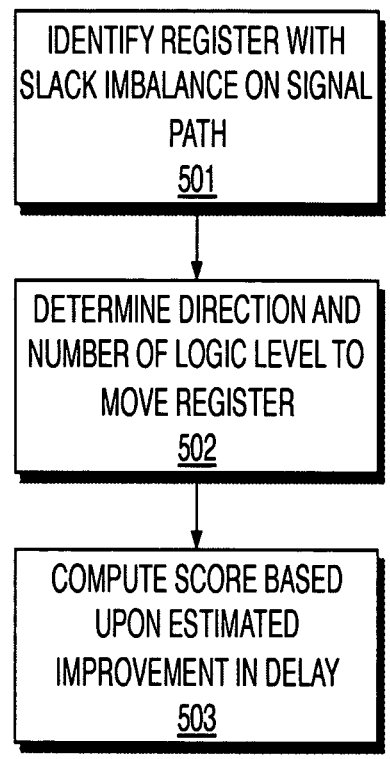
FIG. 5 is a flow chart illustrating a method for performing timing closure analysis on a signal path to address unbalanced logic according to an exemplary embodiment of the present invention.

FIG. 5 is a flow chart illustrating a method for performing timing closure analysis on a signal path to address unbalanced logic according to an exemplary embodiment of the present invention. Unbalanced combinational paths through a series of registers may be another source of timing closure problems. Timing closure may be met if these paths were retimed by moving delay from a high-slack connection to a low-slack connection. This may be achieved by restructuring logic along the path such that a delay from a critical connection is moved to the other side of a register where the connection is less critical. The procedure illustrated in FIG. 5 may be used to implement procedure 106 illustrated in FIG. 1. At 501, a register on a signal path with slack imbalance is identified. According to an embodiment of the present invention, slack imbalance may be defined as when a register has a difference in slack on its input and output sides.

At 502, a direction along a path and number of logic levels to move the register to achieve slack balance is determined. According to an embodiment of the present invention, slack estimations are computed after each move of the register until balance is achieved. A strategy is generated to move the register in the direction determined and for the number of logic levels identified.

At 503, a score for the strategy described at 502 is computed based upon the improvement in delay estimated by performing register retiming. According to an embodiment of the present invention, the score for the strategy provided at 502 is the minimum of 1.0 and [improvement in delay estimated by register retiming/required delay].

It should be appreciated that procedures 501-503 may be performed on every identified register along the signal path with slack imbalance.

Figure 6:
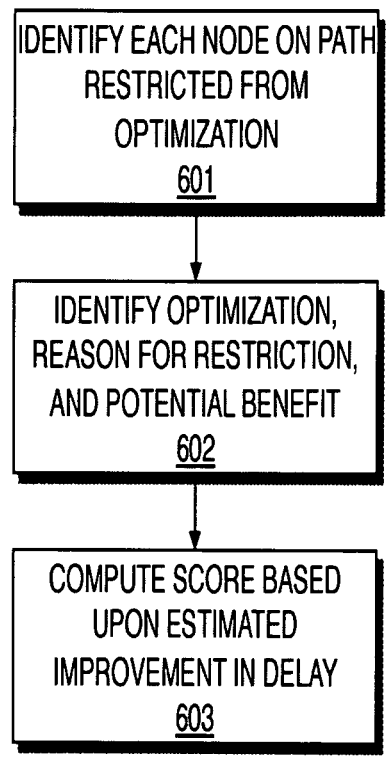
FIG. 6 is a flow chart illustrating a method for performing timing closure analysis on a signal path to address restricted optimizations according to an exemplary embodiment of the present invention.

FIG. 6 is a flow chart illustrating a method for performing timing closure analysis on a signal path to address restricted optimizations according to an exemplary embodiment of the present invention. Some optimization procedures may be disallowed on certain portions of a system. This may negatively impact the quality of results for the design of the system. If many critical paths suffer from restricted optimizations, it may be useful for a designer to understand which optimizations were restricted during compilation and the reason for the restriction. The procedure illustrated in FIG. 6 may be used to implement procedure 106 illustrated in Figure. At 601, each node on a signal path restricted from having an optimization procedure performed on it is identified.

At 602, an identity of the optimization procedure restricted from the nodes, the reason for the restriction, and potential improvement in delay had the optimization procedure been performed are identified. According to an embodiment of the present invention, the identity of the optimization procedure and the reason for restriction is stored as compilation information in an EDA tool. The potential improvement in delay may also be stored as compilation information or may be estimated. A strategy is generated to output the identity of the optimization procedure that is restricted, the reason for the restriction, and the potential improvement in delay to the designer.

At 603, a score for the strategy described at 602 is computed based upon the improvement in delay estimated by performing the optimization. According to an embodiment of the present invention, the score for the strategy provided at 602 is the minimum of 1.0 and [improvement in delay estimated by performing the optimization/required delay].

Figure 7:
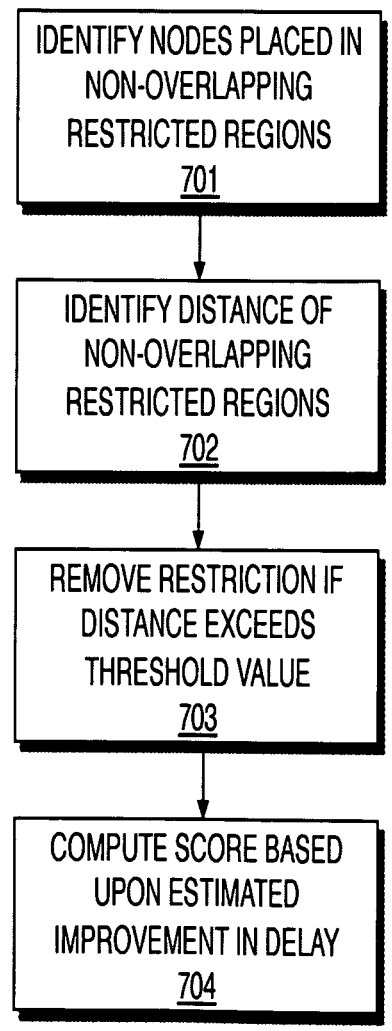
FIG. 7 is a flow chart illustrating a method for performing timing closure analysis on a signal path to address region constraints according to an exemplary embodiment of the present invention.

FIG. 7 is a flow chart illustrating a method for performing timing closure analysis on a signal path to address region constraints according to an exemplary embodiment of the present invention. Region constraints may originate from a designer or be imposed by an EDA tool. Region constraints restrict the placement of nodes to a given sub-section of a target device. If nodes on a signal path are confined to non-overlapping regions on the chip, the timing of the path is likely to be sub-optimal. The procedure illustrated in FIG. 7 may be used to implement procedure 106 illustrated in FIG. 1. At 701, a first node and a second node on a signal path that are placed in non-overlapping restricted regions are identified.

At 702, a distance of the non-overlapping restricted regions is identified.

At 703, a strategy is generated to remove a requirement of having the first node and the second node reside in non-overlapping restricted regions if the distance of the non-overlapping restricted regions exceeds a tolerable distance.

At 704, a score for the strategy described at 703 is computed based upon the improvement in delay estimated by removing the region constraint. According to an embodiment of the present invention, the score for the strategy provided at 703 is the minimum of 1.0 and [improvement in delay estimated by removing the region constraint/required delay].

Figure 8:
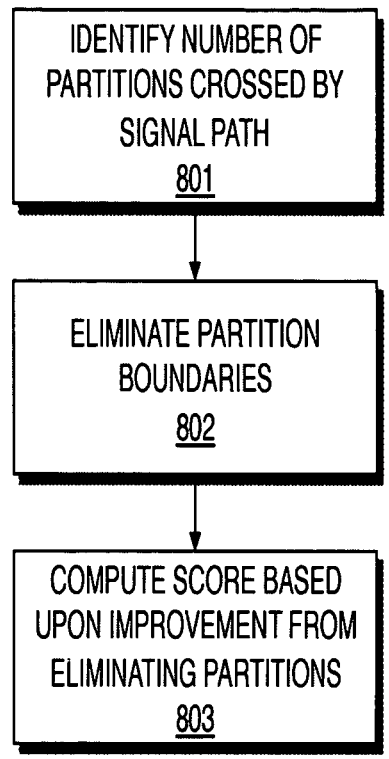
FIG. 8 is a flow chart illustrating a method for performing timing closure analysis on a signal path to address partition constraints according to an exemplary embodiment of the present invention.

FIG. 8 is a flow chart illustrating a method for performing timing closure analysis on a signal path to address partition constraints according to an exemplary embodiment of the present invention. Design partitions are logically independent portions of a design. Optimizations across design partitions are often restricted. It is therefore not desirable to have a signal path cross partition boundaries. Furthermore, partitions may have different levels of preservation where routing on a first partition and synthesis on a second partition is required to be fixed. Signal paths with mixed-preservation-levels are challenging to optimize due to their constraints. The procedure illustrated in FIG. 8 may be used to implement procedure 106 illustrated in FIG. 1. At 801, a number of partitions that a signal path crosses are identified.

At 802, a strategy is generated to remove a partition boundary in response to identifying that the signal path crosses the partition boundary. Alternatively a strategy may be generated to pipeline the paths so that the boundaries are registered, merge the partitions so that optimizations would be permitted across partitions, and/or undo mixed-preservation-levels.

At 803, a score for the strategy described at 802 is computed based upon a number of partitions eliminated. According to an embodiment of the present invention, an estimation is made that for each partition eliminated a level of logic is also eliminated. An improvement in delay may be estimated from the resulting reduction of logic and the score for the strategy provided at 803 is computed by taking the minimum of 1.0 and [improvement in delay estimated by removing the partition(s)/required delay].

Figure 9:
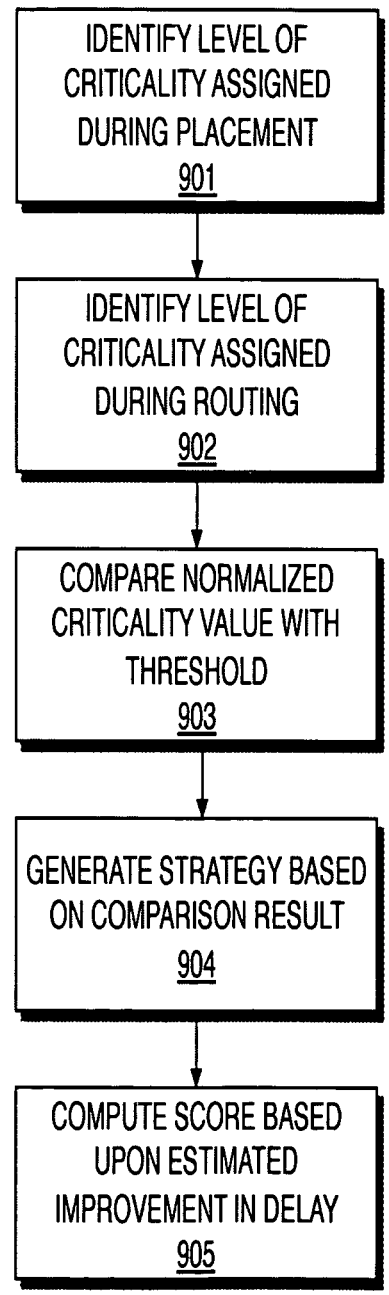
FIG. 9 is a flow chart illustrating a method for performing timing closure analysis on a signal path to address reduced optimization focus according to an exemplary embodiment of the present invention.

FIG. 9 is a flow chart illustrating a method for performing timing closure analysis on a signal path to address reduced optimization focus according to an exemplary embodiment of the present invention. A CAD tool used for designing a system on a target device utilizes its place and route procedures to determine the portions of a system that is most critical. The CAD tool may choose to focus a disproportionate amount of its resource to optimize the most critical portions. Since the CAD tools may not focus its efforts on all portions of a system equally, there may be some failing paths that do not meet timing because the CAD tool was focused on other parts of the design. If the CAD tool failed to recognize that a path is actually critical, it is unlikely to optimize it. The procedure illustrated in FIG. 9 may be used to implement procedure 106 illustrated in FIG. 1. At 901, a level of criticality assigned to a signal path during placement is identified. According to an embodiment of the present invention, the level of criticality assigned during placement may be stored as compilation information by the EDA tool.

At 902, a level of criticality assigned to the signal path during routing is identified. According to an embodiment of the present invention, the level of criticality assigned during routing may be stored as compilation information by the EDA tool.

At 903, a comparison is made between a normalized value generated from the level of criticality of the signal path assigned during placement and routing with a threshold criticality value to determine whether the signal path is critical.

At 904, a strategy is generated in response to determining whether the signal path is critical. According to an embodiment of the present invention, a higher level of criticality is assigned to the signal path for a subsequent compilation in response to determining that the signal path is critical.

At 905, a score for the strategy described at 904 is computed based upon the criticality of the signal path. An improvement in delay maybe estimated by multiplying the optimistic delay for the signal path with the normalized value generated at 903. According to an embodiment of the present invention, the score for the strategy provided at 904 is computed by taking the minimum of 1.0 and [improvement in delay estimated/required delay].

Figure 10:
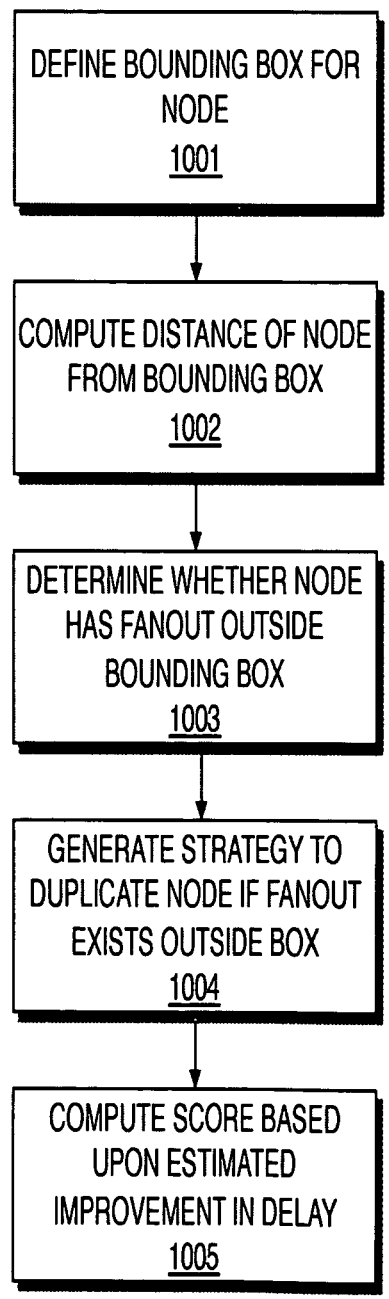
FIG. 10 is a flow chart illustrating a method for performing timing closure analysis on a signal path to address inter-path competition according to an exemplary embodiment of the present invention.

FIG. 10 is a flow chart illustrating a method for performing timing closure analysis on a signal path to address inter-path competition according to an exemplary embodiment of the present invention. When optimizing signal paths, CAD tools often do not optimize each path in isolation, but attempt to find a solution that optimizes all the timing on all paths that go through a node. In some instances, a timing of one path through the node is sacrificed to improve the timing of another. This may be troublesome when the sacrificed path is a critical path. The procedure illustrated in FIG. 10 may be used to implement procedure 106 illustrated in FIG. 1. At 1001, for a node on a signal path being analyzed, an area is defined by the node's fanin node and fanout node. According to an embodiment of the present invention, the area is a bounding box defined by the outermost x and y coordinates of the fanin node and fanout node.

At 1002, a distance of the node from the area is computed.

At 1003, it is determined whether the node has a second fanout outside the area.

At 1004, a strategy is generated for duplicating the node and inserting the duplicated node in the area in response to determining that the distance of the node from the area exceeds a threshold value and that the node has a second fanout node outside the area.

At 1005, a score for the strategy described at 1004 is computed based upon the improvement of delay from duplicating the node. According to an embodiment of the present invention, an improvement in delay maybe estimated by multiplying the distance of the node from the area computed at 1001 by a cost value associated with the distance in term of time. According to an embodiment of the present invention, the cost value may be derived from empirical data. The score for the strategy provided at 1004 may computed by taking the minimum of 1.0 and [improvement in delay estimated/required delay].

It should be appreciated that procedures 1001-1005 may be performed on all the nodes on the signal path.

Figure 11:
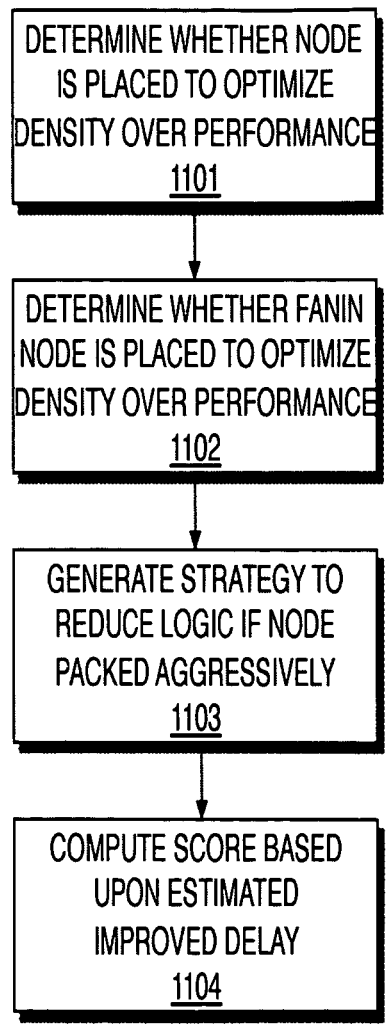
FIG. 11 is a flow chart illustrating a method for performing timing closure analysis on a signal path to address clustering difficulty according to an exemplary embodiment of the present invention.

FIG. 11 is a flow chart illustrating a method for performing timing closure analysis on a signal path to address clustering difficulty according to an exemplary embodiment of the present invention. When finding a legal placement solution, CAD tools may sacrifice performance in order to be aggressive with area optimizations. As such, timing closure issues may arise due to high logic utilization. The procedure illustrated in FIG. 11 may be used to implement procedure 106 illustrated in FIG. 1. At 1101, it is determined whether a node on a signal path being analyzed is placed in a first building block on a target device packed aggressively to optimize density over performance. According to an embodiment of the present invention, the determination may be made by analyzing compilation information stored by an EDA tool.

At 1102, it is determined whether a fanin node to the node on the signal path being analyzed is placed in a second building block on the target device packed aggressively to optimize density over performance. According to an embodiment of the present invention, the determination may be made by analyzing compilation information stored by an EDA tool.

At 1103, a strategy is generated to reduce logic utilization on the system in response to determining that either the first node was placed in a first building block on the target device to optimize density over performance or the second node was placed in a second building block on the target device to optimize density over performance.

At 1104, a score for the strategy described at 1003 is computed based upon an improvement of delay from reducing logic utilization. According to an embodiment of the present invention, the improvement in delay maybe estimated from cell delay and routing delay eliminated from the reduction in logic utilization. The score for the strategy provided at 1103 may be computed by taking the minimum of 1.0 and [improvement in delay estimated/required delay].

Figure 12:
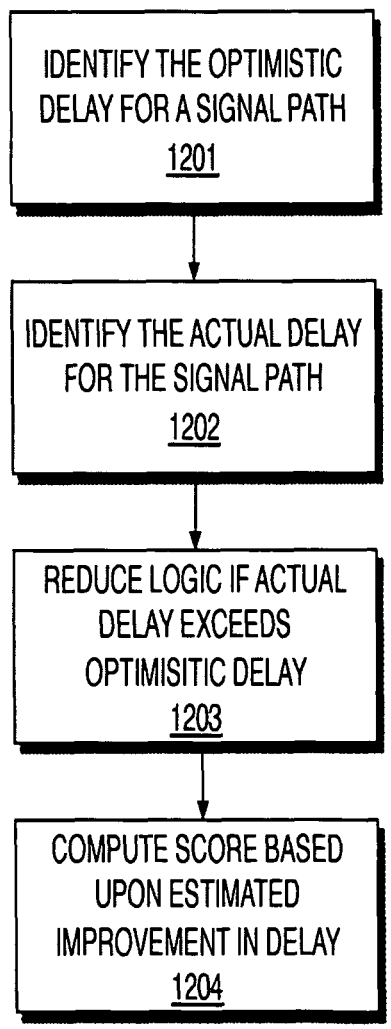
FIG. 12 is a flow chart illustrating a method for performing timing closure analysis on a signal path to address routing congestion according to an exemplary embodiment of the present invention.

FIG. 12 is a flow chart illustrating a method for performing timing closure analysis on a signal path to address routing congestion according to an exemplary embodiment of the present invention. A target device has a limited amount of routing resources. Some routing resources are faster than others. Due to routing congestion, not all connections may be routed optimally for timing. At 1201, an optimistic delay for a signal path is identified. According to an embodiment of the present invention, the optimistic delay for the signal path is the fastest possible delay for the signal path and is stored as compilation information by an EDA tool.

At 1202, the actual delay for the signal path is determined.

At 1203, a strategy is generated to reduce logic utilization on the system in response to determining that the actual delay for the signal path is greater than the optimistic delay.

At 1204, a score for the strategy described at 1003 is computed based upon an improvement of delay from reducing logic utilization. According to an embodiment of the present invention, the improvement in delay maybe estimated from cell delay and routing delay eliminated from the reduction in logic utilization. The score for the strategy provided at 1203 may computed by taking the minimum of 1.0 and [improvement in delay estimated/required delay].

FIGS. 1 through 12 are flow charts that illustrate embodiments of the present invention. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

According to an embodiment of the present invention, a plurality of the procedures described with reference to FIGS. 3-12 are performed to implement procedure 106 illustrated in FIG. 1.

Figure 13:
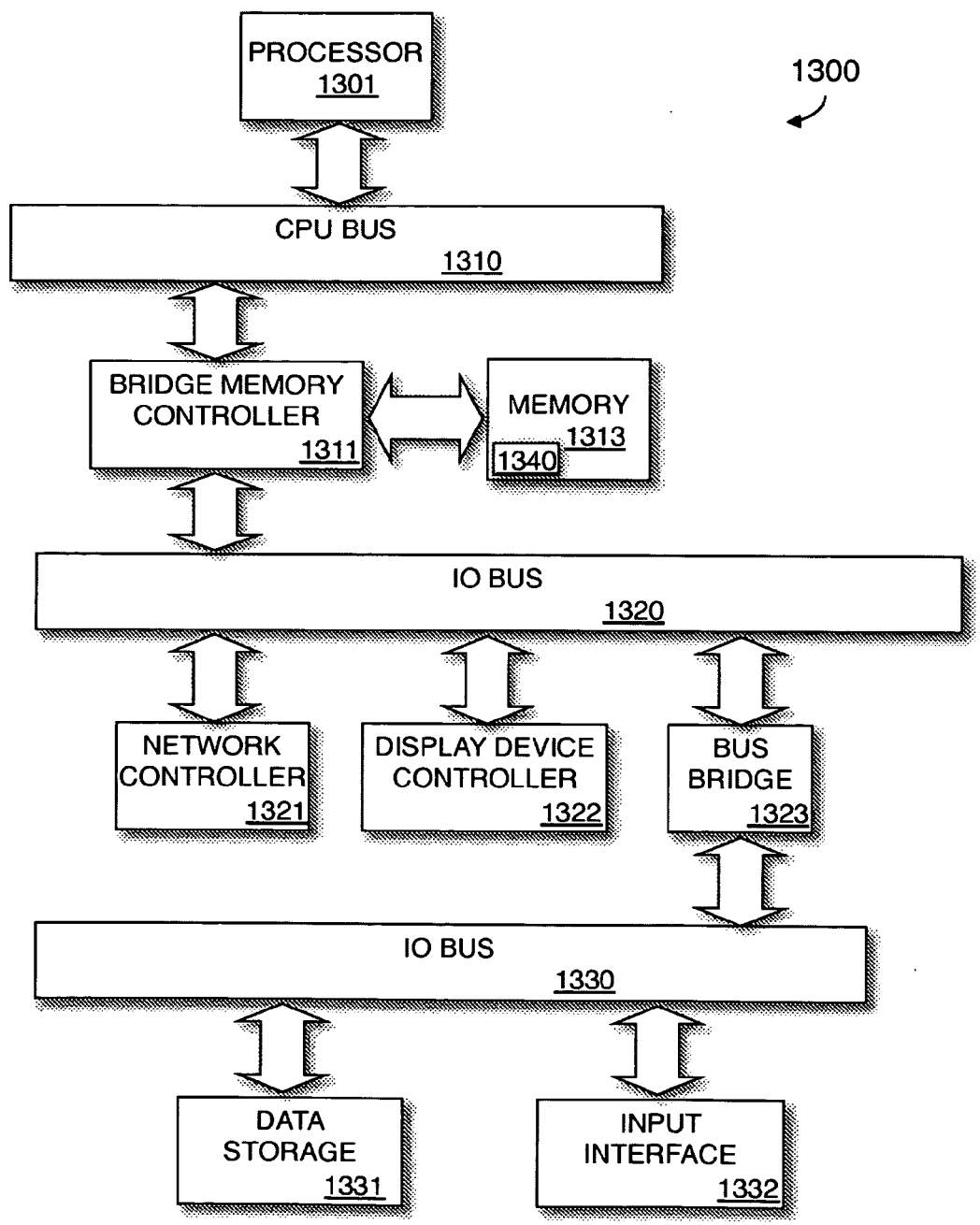
FIG. 13 illustrates a block diagram of a computer system implementing a system designer according to an embodiment of the present invention.

FIG. 13 is a block diagram of an exemplary computer system 1300 in which an example embodiment of the present invention resides. The computer system 1300 includes a processor 1301 that process data signals. The processor 1301 is coupled to a CPU bus 1310 or other switch fabric that transmits data signals between processor 1301 and other components in the computer system 1300.

The computer system 1300 includes a memory 1313. The memory 1313 may store instructions and code represented by data signals that may be executed by the processor 1301. A bridge memory controller 1311 is coupled to the CPU bus 1310 and the memory 1313. The bridge memory controller 1311 directs data signals between the processor 1301, the memory 1313, and other components in the computer system 1300 and bridges the data signals between the CPU bus 1310, the memory 1313, and a first IO bus 1320. According to an embodiment of the present invention, the processor 1301 may be directly coupled to the memory 1313 and communicates with the memory 1313 without a bridge memory controller 1311.

The first IO bus 1320 may be a single bus or a combination of multiple buses. The first IO bus 1320 provides communication links between components in the computer system 1300. A network controller 1321 is coupled to the first IO bus 1320. The network controller 1321 may link the computer system 1300 to a network of computers (not shown) and supports communication among the machines. A display device controller 1322 is coupled to the first 10 bus 1320. The display device controller 1322 allows coupling of a display device (not shown) to the computer system 1300 and acts as an interface between the display device and the computer system 1200.

A second IO bus 1330 may be a single bus or a combination of multiple buses. The second IO bus 1330 provides communication links between components in the computer system 1300. A data storage device 1331 is coupled to the second IO bus 1330. An input interface 1332 is coupled to the second IO bus 1330. The input interface 1332 allows coupling of an input device to the computer system 1300 and transmits data signals from an input device to the computer system 1300. A bus bridge 1323 couples the first IO bus 1320 to the second IO bus 1330. The bus bridge 1323 operates to buffer and bridge data signals between the first IO bus 1320 and the second IO bus 1330. It should be appreciated that computer systems having a different architecture may also be used to implement the computer system 1300.

A system designer 1340 may reside in memory 1313 and be executed by the processor 1301. The system designer 1340 may operate to generate HDL, synthesize a system, place the system on a target device, route the system on the target device, store compilation information, perform timing closure analysis, output strategy for improving timing closure, modify the design, and assemble the system.

Figure 14:
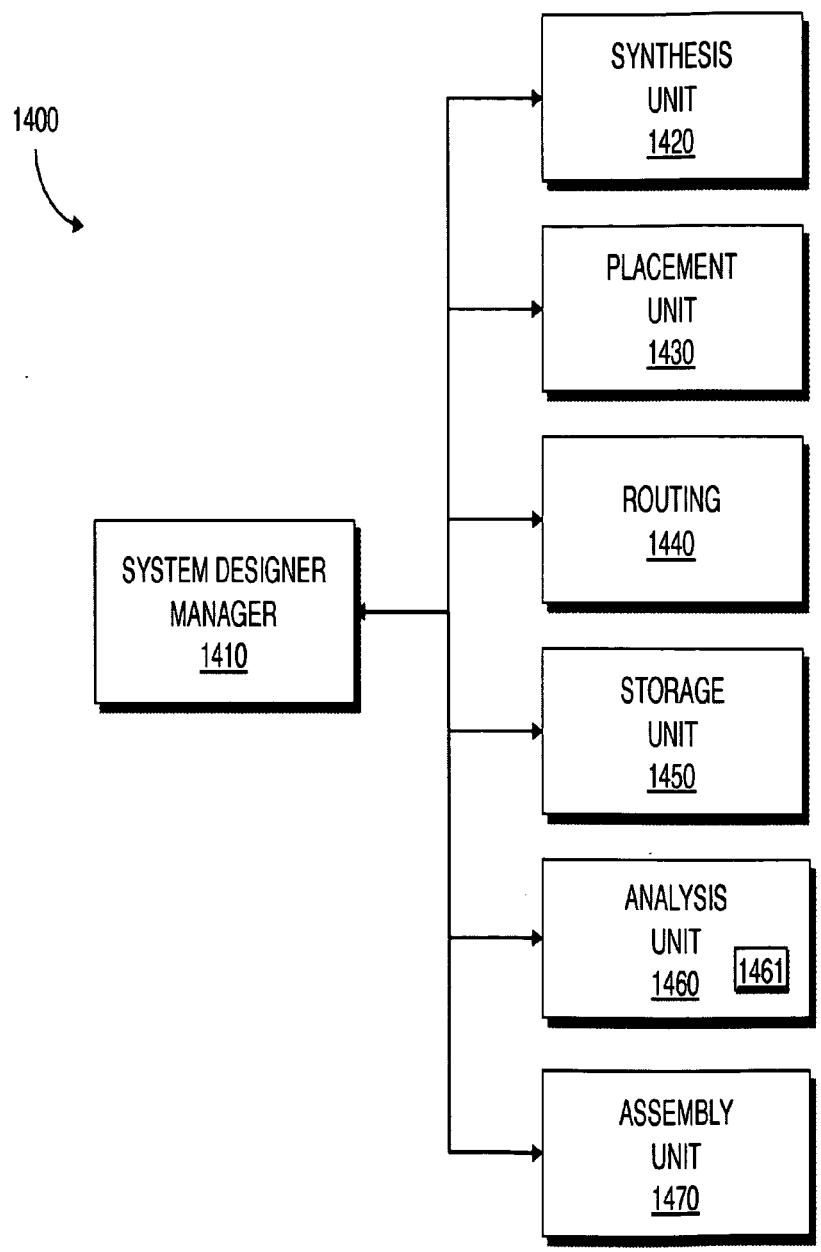
FIG. 14 is a block diagram of a system designer according to an embodiment of the present invention.

FIG. 14 illustrates a system designer 1400 according to an embodiment of the present invention. The system designer 1400 may be an EDA tool for designing a system on a target device such as an FPGA, structured application structured integrated circuit (ASIC), ASIC, or other circuitry. FIG. 14 illustrates modules implementing an embodiment of the system designer 1400. According to one embodiment, the modules represent software modules and system design may be performed by a computer system such as the one illustrated in FIG. 13 executing sequences of instructions represented by the modules shown in FIG. 14. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 1400 includes a designer manager 1410. The designer manager 1410 is connected to and transmits data between the components of the system designer 1400. The designer manager 1410 also generates a representation of the system from a description of the system input by a designer. According to an embodiment of the present invention, the representation of the system generated may be a register transfer language (RTL) representation in a hardware description languages such as Verilog, very-high-speed integrated circuit (VHSIC) hardware description language (VHDL), or other descriptive language.

The system designer 1400 includes a synthesis unit 1420 that performs synthesis. The synthesis unit 1420 generates a logic design of a system to be implemented on the target device. According to an embodiment of the system designer 1400, the synthesis unit 1420 takes a conceptual HDL design definition and generates an optimized logical representation of the system. The optimized logical representation of the system generated by the synthesis unit 1410 may include a representation that has a reduced number of functional blocks and registers, such as logic gates and logic elements, required for the system. Alternatively, the optimized logical representation of the system generated by the synthesis unit 1420 may include a representation that has a reduced depth of logic and that generates a lower signal propagation delay.

The synthesis unit 1420 also performs technology mapping. Technology mapping involves determining how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (IO) elements or other components.

The system designer 1400 includes a placement unit 1430 that processes the optimized technology-mapped netlist to produce a placement for each of the functional blocks. The placement identifies which components or areas on the target device are to be used for specific functional blocks and registers.

The system designer 1400 includes a routing unit 1440 that performs routing. The routing unit 1440 determines the routing resources on the target device to use to provide interconnection between the components implementing functional blocks and registers of the logic design.

The system designer 1400 includes a storage unit 1450 that stores compilation information used by or generated by the synthesis unit 1420, placement unit 1430, and the routing unit 1440. According to an embodiment of the present invention, the compilation information may include netlists, assignments, timing analysis data, and information used by an EDA tool to make compilation decisions resulting in design tradeoffs. The storage unit 1450 may operate to perform the procedure descried with reference to FIG. 2.

The system designer 1400 includes an analysis unit 1460 that performs timing closure analysis. According to an embodiment of the present invention, one or more timing closure analysis procedures, as illustrated in FIGS. 3-12, may be performed by the analysis unit 1460 to determine potential causes of timing failures in the system and to derive a design-specific strategy on how to address the timing failure. Synthesis, placement, and routing utilize compilation procedures that apply heuristic-based optimizations that make tradeoffs.

The timing closure analysis procedures may utilize the compilation information stored at storage unit 1450 to derive a strategy that addresses timing failures. By analyzing the design tradeoffs made during an earlier compilation of the design with post-compilation results, suitable alternative approaches to achieve timing closure may be derived.

The analysis unit 1460 includes a confidence unit 1461 that generates a score to indicate a value of a strategy generated. The score may reflect a level of confidence on the strategy and may be based upon an estimated improvement in timing from using the strategy. According to an embodiment of the present invention, a score between 0 and 1.0 is generated for each strategy, with 1.0 representing a highest confidence level for the strategy. For a given path, the data required time from a source to sink is designated the value $D_R$. The estimated time which a generated strategy improves timing from the source to sink is designated the value $D_I$. The confidence is calculated as the minimum of 1.0 and $D_I/D_R$.

The system designer manager 1410 outputs a strategy for improving timing closure on a signal path in the system is output with a score. According to an embodiment of the present invention, the system design manager outputs a plurality of strategies for a single signal path. Based upon the score associated with a strategy, a designer may determine which of the strategies to implement. According to an embodiment of the present invention, timing analysis is performed for a plurality of signal paths. In this embodiment, the strategies having a score exceeding a threshold number are determined to be successful strategies. The number of times a particular strategy is determined to be successful may be output. This information may be helpful in identifying re-occurring issues in the design of the system.

Based on the strategy provided by the analysis unit 1460, the synthesis unit 1420, placement unit 1430, and routing unit 1440 may re-compile the design after changing the HDL for the system, user constraints, design constraints, and/or other parameters.

The system designer 1400 includes an assembly unit 1470 that performs an assembly procedure that creates a data file that includes the design of the system generated by the system designer 1400. The data file may be a bit stream that may be used to program the target device. The assembly unit 1470 may output the data file so that the data file may be stored or alternatively transmitted to a separate machine used to program the target device. It should be appreciated that the assembly unit 1470 may also output the design of the system in other forms such as on a display device or other medium.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 15:
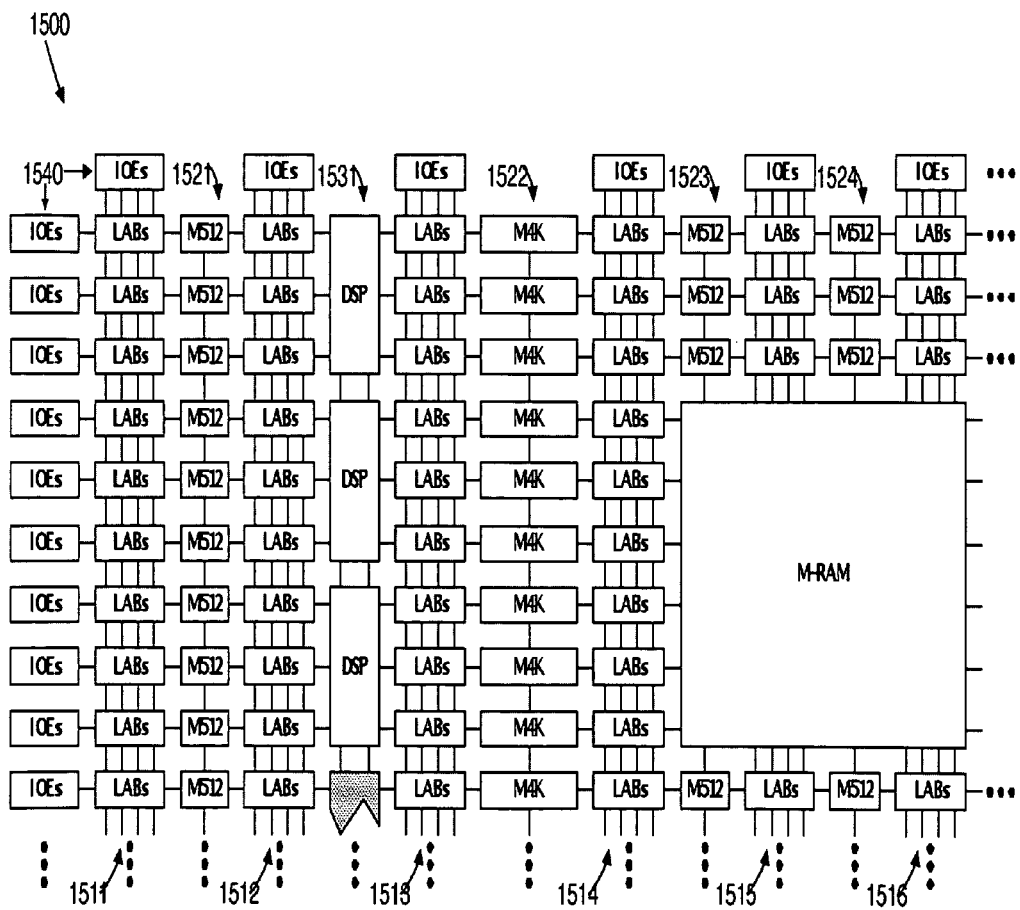
FIG. 15 illustrates an exemplary target device according to an embodiment of the present invention.

FIG. 15 illustrates a device 1500 that may be used to implement a target device according to an embodiment of the present invention. The device 1500 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1500. Columns of LABs are shown as 1511-1516. It should be appreciated that the logic block may include additional or alternate components.

The device 1500 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1500. Columns of memory blocks are shown as 1521-1524.

The device 1500 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1500 and are shown as 1531.

The device 1500 includes a plurality of input/output elements (IOEs) 1540. Each IOE feeds an IO pin (not shown) on the device 1500. The IOEs 1540 are located at the end of LAB rows and columns around the periphery of the device 1500. Each IOE may include a bidirectional IO buffer and a plurality of registers for registering input, output, and output-enable signals.

The device 1500 may include routing resources such as LAB local interconnect lines, row interconnect lines ("H-type wires"), and column interconnect lines ("V-type wires") (not shown) to route signals between components on the target device.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for generating a design for a system to be implemented on a target device, the method comprising:
storing information used for a compilation of the design;
deriving a strategy to improve timing closure on a signal path on the design using information stored that was used for a compilation of the design;
computing a score indicative of effectiveness of the strategy for improving the timing closure on the signal path, wherein the score is a function of an estimated amount of delay reduced by implementing the strategy and a required delay for the signal path; and
outputting the strategy with the score, wherein at least one of the storing, deriving, computing, and outputting is performed by a processor.

2. The method of claim 1, wherein deriving the strategy comprises:
identifying an optimistic delay on the signal path from the information; and
identifying a number of level of logic to remove from the signal path for a realistic delay on the signal path to be less than or equal to the optimistic delay.

3. The method of claim 1, wherein deriving the strategy comprises:
computing a first clock skew between a source node and sink node on the signal path, wherein clock signals are transmitted on a standard clock network;
computing a second clock skew between the source node and the sink node, wherein the clock signals are transmitted on a low-skew global clock network; and
transmitting the clock signals to the source node and the sink node on the low-skew global clock network if the first clock skew is greater than the second clock skew.

4. The method of claim 1, wherein deriving the strategy comprises:
identifying a register on the signal path with slack imbalance; and
identifying a direction and number of logic levels to move the register to reduce the slack imbalance.

5. The method of claim 1, wherein deriving the strategy comprises:
identifying a node on the signal path having a disallowed optimization; and
optimizing a subsequent compilation.

6. The method of claim 1, wherein deriving the strategy comprises:
determining whether a first node and a second node on the signal path are placed in non-overlapping restricted regions; and
removing a requirement of having the first node and the second node placed in non-overlapping restricted regions in response to determining that the first node and the second node are placed beyond a tolerable distance.

7. The method of claim 1, wherein deriving the strategy comprises:
determining whether the signal path crosses a partition boundary; and
removing the partition boundary in response to determining that the signal path crosses the partition boundary.

8. The method of claim 1, wherein deriving the strategy comprises:
identifying a level of criticality assigned to the signal path during the compilation of the design from the information; and
assigning a higher level of criticality to the signal path on a subsequent compilation in response to determining that the level of criticality exceeds a threshold level.

9. The method of claim 1, wherein deriving the strategy comprises:
determining whether a node on the signal path residing outside an area defined by a fanin node and a first fanout node has a second fanout node also residing outside the area; and
duplicating the node in response to determining that the node has the second fanout node also residing outside the area.

10. The method of claim 1, wherein deriving the strategy comprises:
determining from the information whether a first node on the signal path placed in a first logic array block or second node on the signal path placed on a second logic array block were placed to improve density over performance; and
reducing logic utilization in the system in response to determining that either the first node or the second node was placed to improve density over performance.

11. The method of claim 1, wherein deriving the strategy comprises:
comparing a delay on the signal path with an optimistic delay; and
reducing logic utilization in response to determining that the delay is greater than the optimistic delay.

12. The method of claim 1, wherein computing the score comprises taking a minimum of a value 1 and [(an estimated amount of delay reduced by implementing the strategy)/(a required delay for the signal path)].

13. The method of claim 1, wherein the score is a numerical value.

14. A non-transitory computer readable medium including a sequence of instructions stored thereon for causing a computer to execute a method comprising:
compiling a design of a system on a target device;
storing information used to make a compilation decision on the design;
deriving a strategy to improve timing closure on a signal path on the design using the information; and
computing a score indicative of effectiveness of the strategy for improving the timing closure on the signal path, wherein the score is a function of an estimated amount of delay reduced by implementing the strategy and a required delay for the signal path.

15. The non-transitory computer readable medium of claim 14, wherein the information comprises placement constraints on nodes on the signal path.

16. The non-transitory computer readable medium of claim 14, wherein the information comprises a level of criticality assigned to the signal path.

17. The non-transitory computer readable medium of claim 14, wherein the information comprises an indication of whether a node on the signal path is placed on a building block on the target device that improves density at a cost of performance.

18. The non-transitory computer readable medium of claim 14, wherein the information comprises an identity of an optimization disallowed for a node on the signal path and a reason for the disallowance.

19. The non-transitory computer readable medium of claim 14, wherein the information comprises a maximum delay and minimum delay required for routing a signal on the signal path.

20. The non-transitory computer readable medium of claim 14, wherein the information comprises an optimistic routing delay for the signal path.

21. The non-transitory computer readable medium of claim 14, wherein compiling the design of the system comprises performing synthesis, placement, and routing of the design.

22. The non-transitory computer readable medium of claim 14, wherein the score is a numerical value.

23. A system designer comprising:
a synthesis unit;
a placement unit;
a routing unit;
a storage unit operable to store information used to make a compilation decision on a design by at least one of the synthesis unit, placement unit, and routing unit; and
an analysis unit operable to derive a strategy to improve timing closure on a signal path on the design using the information and operable to compute a score indicative of effectiveness of the strategy for improving the timing closure on the signal path, wherein the score is a function of an estimated amount of delay reduced by implementing the strategy and a required delay for the signal path.

24. The system designer of claim 23, wherein the analysis unit computes the score by taking a minimum of a value 1 and [(an estimated amount of delay reduced by implementing the strategy)/(a required delay for the signal path)].

25. The system designer of claim 23 further comprising a system designer manager operable to output the strategy with the score.

26. The system designer of claim 23, wherein the score is a numerical value.

* * * * *